(12) United States Patent
Lim et al.

(10) Patent No.: US 6,888,904 B2
(45) Date of Patent: May 3, 2005

(54) 108-TAP 1:4 INTERPOLATION FIR FILTER FOR DIGITAL MOBILE TELECOMMUNICATION

(75) Inventors: In-Gi Lim, Taejon (KR); Suk-Ho Lee, Taejon (KR); Kyung-Soo Kim, Taejon (KR); Han-Jin Cho, Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 742 days.

(21) Appl. No.: 09/866,277

(22) Filed: May 24, 2001

(65) Prior Publication Data

US 2002/0067765 A1 Jun. 6, 2002

(30) Foreign Application Priority Data

Jul. 31, 2000 (KR) .......................................... 2000-44405

(51) Int. Cl.[7] .......................... H03K 5/159; G06F 17/17
(52) U.S. Cl. ....................................... 375/350; 708/313
(58) Field of Search ................................. 375/229, 232, 375/350; 370/291; 708/313, 319, 322, 323

(56) References Cited

U.S. PATENT DOCUMENTS

| | | | | |
|---|---|---|---|---|
| 5,274,469 A | * | 12/1993 | Small et al. | ................ 358/445 |
| 5,297,069 A | * | 3/1994 | Asato et al. | ................ 708/319 |
| 5,870,431 A | | 2/1999 | Easton et al. | ................ 375/230 |
| 5,966,314 A | * | 10/1999 | Lee | ............................. 708/319 |
| 6,487,190 B1 | * | 11/2002 | Regis | ......................... 370/342 |
| 2002/0075953 A1 | * | 6/2002 | Lim et al. | |
| 2002/0145970 A1 | * | 10/2002 | Han et al. | |

FOREIGN PATENT DOCUMENTS

| KR | 96-8222 | 6/1996 |
|---|---|---|
| KR | 97-2955 | 3/1997 |

* cited by examiner

*Primary Examiner*—Young T. Tse
(74) *Attorney, Agent, or Firm*—Seed IP Law Group PLLC

(57) ABSTRACT

A 108-tap 1:4 interpolation FIR filter device for digital mobile telecommunication having a single bit input that employs a look-up table minimum scheme and a pipeline structure in which the size of the entire look-up tables is significantly reduced by dividing four coefficient groups into three parts, respectively, and effectively using the symmetry of the 108-tap filter coefficient and the symmetry within the look-up table. The FIR filter includes an input shift register and selector for processing a single bit input of four channels, an address generator for producing addresses of the look-up table, look-up table group 0~3 for producing filter outputs group by group via the look-up table and the calculator using the address as an input, a pipeline register I for delaying the filter outputs for coefficient group which are outputted in parallel, a group selector for converting the delayed outputs in serial channel by channel, and a pipeline register II for matching the time of filter output channel by channel.

4 Claims, 8 Drawing Sheets

FIG. 4

| Total 108 Tap | 0 | 1 | ... | 22 | 23 | 24 | 25 | ... | 46 | 47 | 48 | ... | 59 | 60 | 61 | ... | 82 | 83 | 84 | 85 | ... | 106 | 107 |
|---|---|---|---|---|---|---|---|---|---|---|---|---|---|---|---|---|---|---|---|---|---|---|---|
| | LUT_0 | | | | | LUT_1 | | | | | LUT_C | | | | LUT_2 | | | | | LUT_3 | | | |

| Look-up table group 0 | 0 | 4 | 8 | 12 | 16 | 20 | 24 | 28 | 32 | 36 | 40 | 44 | 48 | 52 | 56 | 60 | 64 | 68 | 72 | 76 | 80 | 84 | 88 | 92 | 96 | 100 | 104 |
|---|---|---|---|---|---|---|---|---|---|---|---|---|---|---|---|---|---|---|---|---|---|---|---|---|---|---|---|
| | $2^5$ LUT0_0 | | | | | | $2^5$ LUT0_1 | | | | | | $2^5$ LUT0_C | | | | | $2^5$ LUT0_2 | | | | | | $2^5$ LUT0_3 | | | |

| Look-up table group 1 | 1 | 5 | 9 | 13 | 17 | 21 | 25 | 29 | 33 | 37 | 41 | 45 | 49 | 53 | 57 | 61 | 65 | 69 | 73 | 77 | 81 | 85 | 89 | 93 | 97 | 101 | 105 |
|---|---|---|---|---|---|---|---|---|---|---|---|---|---|---|---|---|---|---|---|---|---|---|---|---|---|---|---|
| | $2^5$ LUT1_0 | | | | | | $2^5$ LUT1_1 | | | | | | $2^5$ LUT1_C | | | | | $2^5$ LUT1_2 | | | | | | $2^5$ LUT1_3 | | | |

| Look-up table group 2 | 2 | 6 | 10 | 14 | 18 | 22 | 26 | 30 | 34 | 38 | 42 | 46 | 50 | 54 | 58 | 62 | 66 | 70 | 74 | 78 | 82 | 86 | 90 | 94 | 98 | 102 | 106 |
|---|---|---|---|---|---|---|---|---|---|---|---|---|---|---|---|---|---|---|---|---|---|---|---|---|---|---|---|
| | $2^5$ LUT2_0 | | | | | | $2^5$ LUT2_1 | | | | | | $2^5$ LUT2_C | | | | | $2^5$ LUT2_2 | | | | | | $2^5$ LUT2_3 | | | |

| Look-up table group 3 | 3 | 7 | 11 | 15 | 19 | 23 | 27 | 31 | 35 | 39 | 43 | 47 | 51 | 55 | 59 | 63 | 67 | 71 | 75 | 79 | 83 | 87 | 91 | 95 | 99 | 103 | 107 |
|---|---|---|---|---|---|---|---|---|---|---|---|---|---|---|---|---|---|---|---|---|---|---|---|---|---|---|---|
| | $2^5$ LUT3_0 | | | | | | $2^5$ LUT3_1 | | | | | | $2^5$ LUT3_C | | | | | $2^5$ LUT3_2 | | | | | | $2^5$ LUT3_3 | | | |

| Input shift register & selector ouput | 6 bit | 6 bit | 3 bit | 6 bit | 6 bit |
|---|---|---|---|---|---|
| | A[26:21] | A[20:15] | A[14:12] | A[11:6] | A[5:0] |

108-TAP 1:4 INTERPOLATION FIR FILTER FOR DIGITAL MOBILE TELECOMMUNICATION

TECHNICAL FIELD

The invention relates generally to a 108-tap 1:4 interpolation FIR (Finite Impulse Response) filter device used in an IMT-2000 (International Mobile Telecommunication in the year 2000) synchronous/asynchronous modulator. More particularly, the invention relates to a 108-tap 1:4 interpolation FIR filter device capable of simultaneously performing four filter operations without increasing the speed of an operating clock using a pipeline scheme and a look-up table scheme.

BACKGROUND OF THE INVENTION

In a modulator for digital mobile telecommunication, the pulse shaping interpolation filtering is required in order to prohibit an inter-symbol interference at the rear end of the modulator. Specially, in case of an IMT-2000 synchronous terminal modulator as a next-generation mobile communication system, as a 1-bit output of four channels is multiplied by a gain within a single chip, channels are added two by two and result are experienced by OCQPSK modulation, two FIR filters having n-bit input are required.

FIG. 1 illustrates a construction of an OCQPSK modulating device specified in an IMT-2000 synchronous terminal rule to which the present invention is applied. The OCQPSK modulating device is mainly consisted of an OCQPSK modulating block and a FIR filter block, which are consisted of a Walsh covering stage for discriminating four channels, a gain stage for adjusting gains of respective channels, a channel adder, an OCQPSK modulating stage and a FIR filter for pulse shaping.

Explaining in more detail, 1-bit input of four channels CH1, CH2, CH3 and CH4 is Walsh-covered by Walsh quadrature codes Walsh2, Walsh3 and Walsh4 10 for by means of exclusive-OR gates 11, 12 and 13 for channel discrimination. Next, the 1-bit input is inputted to the gain stage 20 in which the gains G1, G2, G3 and G4 of respective channels are multiplied by means of the multipliers 21, 22, 23 and 24, in order to adjust gains of respective channels for channel discrimination. Then, the outputs of n-bits type from the gain stage are added two by two in the adders 31 and 32 in the channel adder 30, thereby producing two quadrature signals DI and DQ.

These two quadrature DI and DQ signals are modulated in the OCQPSK modulator 40. The OCQPSK modulator 40 includes a PN spreader 41 using PN sequence generated in a long & short PN generator 49, a complex adder 42 for performing a complex multiplication for the PN sequence based on an OCQPSK modulation scheme, multipliers 43, 44, 45 and 46, and adders 47 and 48. The outputs from the OCQPSK modulator 40 are inputted, in a n-bit type, to FIR filter 50. The FIR filter 50 is consisted of two FIR filter 51 and 52 each having n-bits inputs for pulse shaping, where the outputs of n-bits type are FIR-filtered. The output signals from the two FIR filters 51 and 52 are then inputted to D/A converters 60 and 61 of an analog chip, modulated 62 and 63, multipled by gain 64, and outputted.

This type of modulator, however, has a problem that the usage amount of hardware becomes large because two FIR filters 51 and 52 having n-bits inputs must be implemented using multipliers.

In order to solve this problem, by changing the arrangement of respective functional blocks in the modulating device shown in FIG. 1 and allowing the modulating device to be operated in the sequence of the Walsh covering stage, the 1-bit PN Spreader, the 1-bit FIR Filter, the gain stage, the channel adder and the complex adder, although this structure has the same functions to the previous structure, it can reduce the usage amount of hardware to be implemented and use a 1-bit input FIR filter for 4-channel capable of the usage amount of hardware is reduced, instead of using n-bits input FIR filter having a large usage amount of hardware.

The present invention proposes a design technology for VLSI (Very Large Scale Integration) implementation of a 1-bit input FIR filter for 4-channel. Conventionally, a FIR filter design technology of a look-up table scheme for 2-channel has been employed.

FIG. 2 illustrates a construction of a conventional FIR filter device of a look-up table scheme for 2-channel.

As shown in FIG. 2, the FIR filter device includes I-channel 12-bits shift registers 70 and 71, Q-channel 12-bit shift registers 72 and 73, 6-bit 2×1 MUX 74 and 75, 256×11-bit look-up table ROM_0 and ROM_1 76 and 77, and an 11-bit adder 78. Because a 1-bit input data used in operation of the 48-tap 1:4 interpolation FIR filter is twelve (12), I-channel and Q-channel 12-bit shift registers 70, 71, 72 and 73 are required. Twelve binary filter inputs of the I-channel and the Q-channel are inputted to twelve bit shift registers, respectively.

These inputs are divided into two groups each of which includes 6 bits and IR1[5:0] 70 and QR1 [5:0] 72 are multiplexed by a 6-bit MUX 74. Also, 2-bit group selection clock is attached to the result so as to address a 256×11-bit ROM_0 76. In the same way, IR2[5:0] 71 and QR2[5:0] 73 are multiplexed by a 6-bit MUX 75 and 2-bit group selection clock is then attached to the result so as to address a 256×11-bit ROM_1 77.

Two look-up table outputs from the two ROM 76 and 77 are added in a 11-bit adder 78, which then produces a final filter output. Because these procedures are sequentially performed for four coefficient groups, 1:4 interpolation filter operation is performed by which four-time outputs are created for one-time filter input, and the inputs, I-channel and Q-channel the filter are alternately selected by means of the multiplexers 74 and 75. Therefore, the filter outputs of the I-channel and the Q-channel are outputted in a multiplexed form.

This type of the 48-tap 1:4 interpolation FIR filter can have the following filter coefficient groups.

G0 = {C0, C4, C8, C12, C16, C20, C24, C28, C32, C36, C40, C44}
G1 = {C1, C5, C9, C13, C17, C21, C25, C29, C33, C37, C41, C45}
G2 = {C2, C6, C10, C14, C18, C22, C26, C30, C34, C38, C42, C46}
G3 = {C3, C7, C11, C15, C19, C23, C27, C31, C35, C39, C43, C47}

That is, four coefficient groups G0, G1, G2 and G3 are used for the filter operation. The number of the output value that can be produced by filter operation per each group is $2^{12}$. Therefore, assuming that the output value of the look-up table is 11-bits, it is required that the size of the look-up table be $2^{12} \times 11$-bit per respective coefficient groups. For the purpose of the efficiency of the design area, if the size of the filter input shift register becomes 6 bits by dividing it by two and two look-up tables and one adder are used, a look-up table having the size of $2 \times 2^6 \times 11$-bit can be designed as shown in FIG. 2. As a result, the size of the final look-up table that performs four coefficient group operations becomes $2 \times 4 \times 2^6 \times 11 = 2 \times 256 \times 11$-bit.

Upon implementation of 48-tap 1:4 interpolation FIR filter using this design technology of a look-up table scheme for 2-channel, the hardware structure may be simplified. However, if two output filter operation is to be performed in order to simultaneously transmit produce outputs from two filters, a read operation on the memory must be performed twice faster. In addition, in order to design a 108-tap 1:4 interpolation FIR filter for 4-channel, the operating frequency of the filter must be faster by four times. Also, as the size of the look-up table ROM requires 2×4×2⁻⁵ ×11-bit, the size of the look-up table becomes greater at least 100 times than that of the 48 tap.

As such, if the 108-tap 1:4 interpolation FIR filter is implemented using a conventional technology, the size of a filter design area and the frequency of an operating frequency are increased since the number of a filter tap and the number of channel to be supported are increased.

SUMMARY OF THE INVENTION

Therefore, the present invention provides a 108-tap 1:4 interpolation FIR filter device capable of simultaneously performing four filter operations without increasing the speed of an operating clock using a pipeline scheme and a high-speed operation scheme of a look-up table scheme.

Another object of the present invention is to provide a 108-tap 1:4 interpolation FIR filter device for digital mobile communication capable of significantly reducing the size of a look-up table and operation by effectively applying symmetry of 108-tap coefficients and symmetry within a look-up table to divided coefficient parts.

In order to accomplish the objects, a 108-tap 1:4 interpolation FIR filter device for digital mobile communication according to the present invention is characterized in that it comprises four shift registers for shifting an storing 1-bit filter inputs each inputted from four channels to produce 27-bit parallel data, respectively; a selector for sequentially selecting the outputted parallel data of the four channels one by one; an address generator for receiving the 27-bit parallel data outputted from the selector to produce addresses depending on look-up tables of each of coefficient groups; four look-up table groups for generating filter outputs of the coefficient groups using the addresses generated in the address generator; a pipeline register I for delaying filter outputs per coefficient groups outputted from the four look-up table groups; a group selector for serially transforming the delayed outputs from the pipeline register I, channel by channel; and a pipeline register II for delaying the output from the group selector to match the time of the filter output per channel.

BRIEF DESCRIPTION OF THE DRAWINGS

The aforementioned aspects and other features of the present invention will be explained in the following description, taken in conjunction with the accompanying drawings, wherein:

FIG. 4 illustrates a construction of coefficient address division and look-up table according to the present invention;

DETAILED DESCRIPTION OF THE INVENTION

The present invention will be described in detail by way of a preferred embodiment with reference to accompanying drawings.

Figure 1:
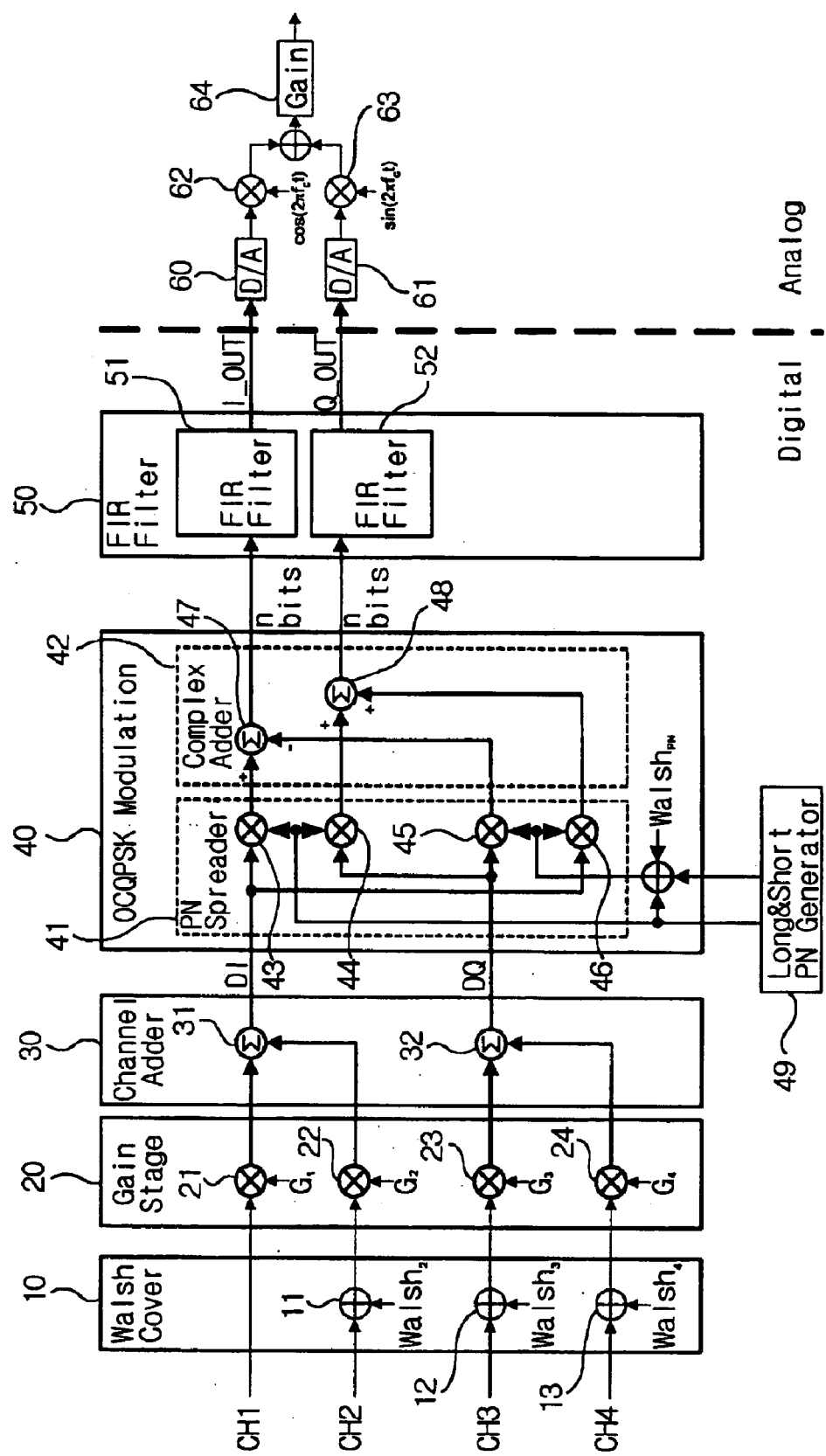
FIG. 1 illustrates a construction of an OCQPSK modulating device in a modulator proposed by a general IMT-2000 (International Mobile Telecommunication in the year 2000) synchronous terminal rule.
Figure 2:
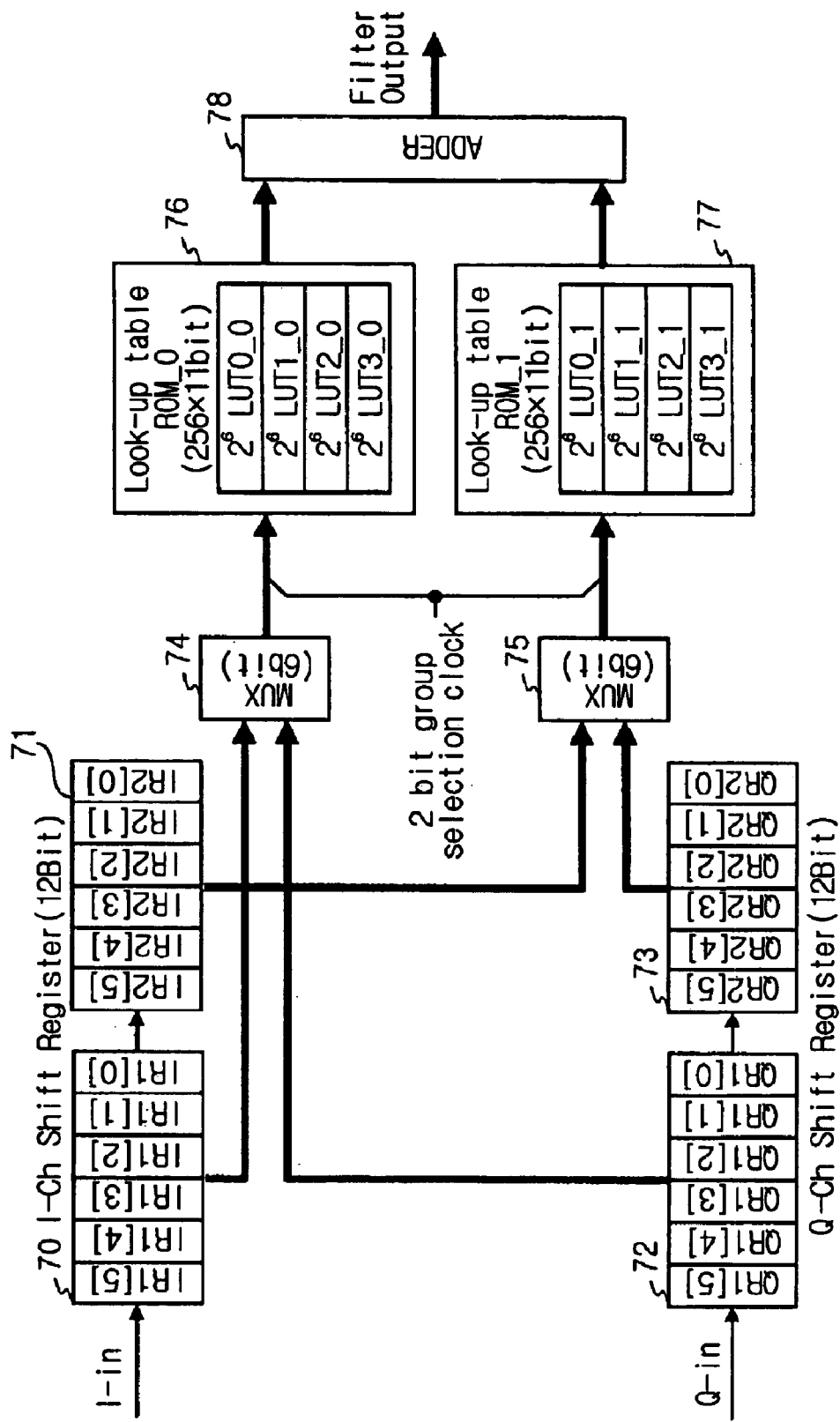
FIG. 2 illustrates a construction of a conventional FIR filter device of a look-up table scheme for 2-channel.
Figure 3:
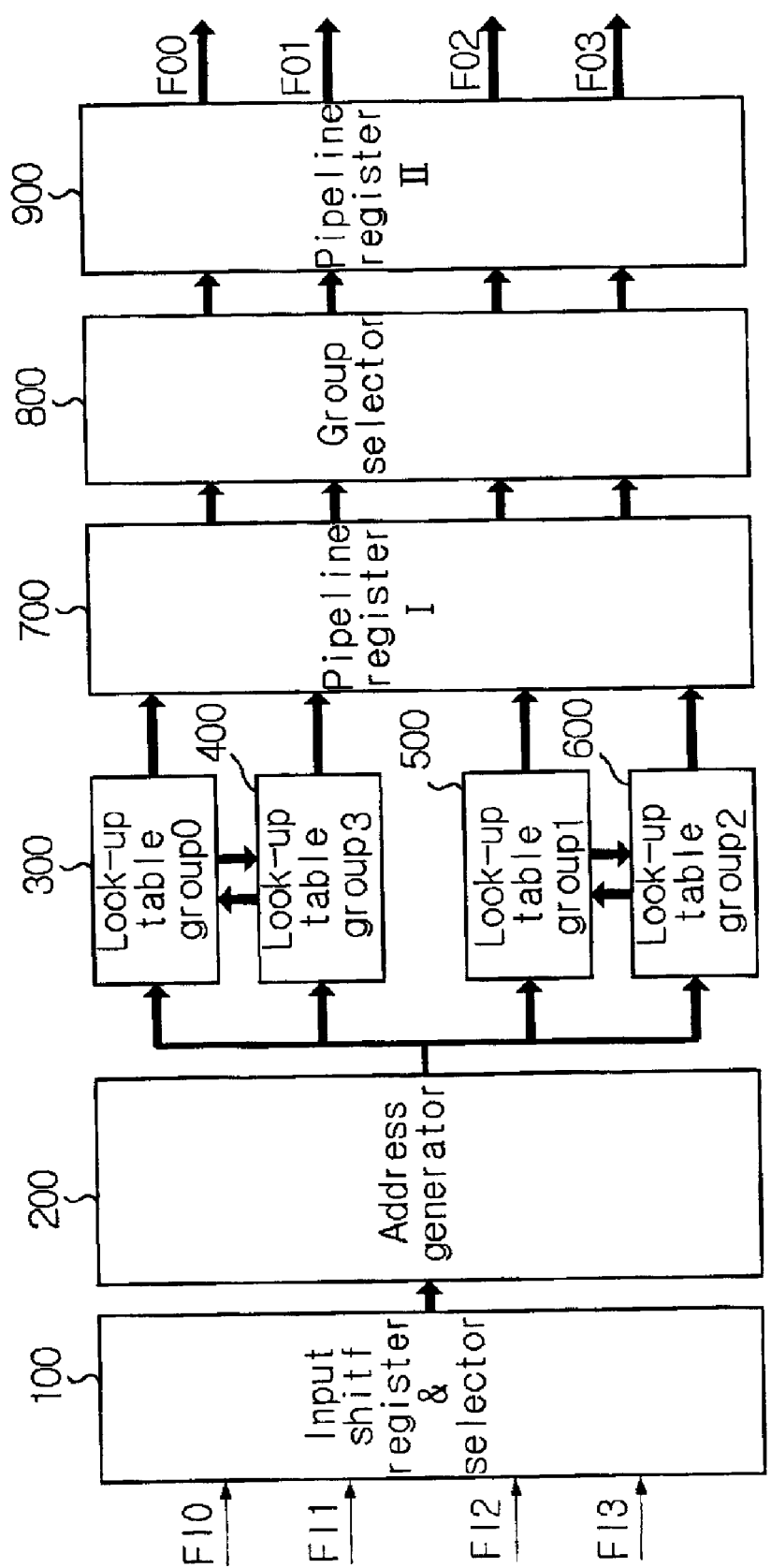
FIG. 3 illustrates a construction of a 108-tap 1:4 interpolation FIR filter according to one embodiment of the present invention.

Referring now to FIG. 3, there is showing that a construction of a 108-tap 1:4 interpolation FIR filter of a single bit input for four channels according to one embodiment of the present invention. The 108-tap 1:4 interpolation FIR filter in cludes an shift register & selector 100, an address generator 200, a look-up table group 0 300, a look-up table group 3 400, a look-up table group 1 500 and a look-up table group 2 600, for producing filter coefficients group by group using a look-up table and operating them, a pipeline register 1 700, a group selector 800), and a pipeline register II 900.

FIG. 4 illustrates a construction of coefficient address division and look-up table according to the present invention. As shown, a 1:4 interpolation filter having the number of tap is 108 taps is designed, and the right and left symmetry of 0~53 and 54~107 of filter coefficients is also utilized. In order to reduce the size of a look-up table, the coefficients of 108 taps are divided into five parts as follows.

LUT_0 = {C0, C1, C2, C3, . . . , C22, C23} (24 coefficients)
LUT_1 = {C24, C25, C26, . . . , C46, C47} (24 coefficients)
LUT_C = {C48, C49, C50, . . . , C58, C59} (12 coefficients)
LUT_2 = {C60, C61, C62, . . . , C82, C83} (24 coefficients)
LUT_3 = {C84, C85, C86, . . . , C106, C107} (24 coefficients)

In the above five parts, LUT_0 and LUT_3, LUT_1 and LUT_2 have the same coefficients due to their right and left symmetry of the coefficient. The 12 coefficients of LUT_C 4 become 3 if being divided by 4. Thus, it would be very effective to further reduce the size of the circuit if the right and left symmetry of the coefficients is not omitted. These five coefficient parts are divided into the following four coefficient groups, respectively, for the 1:4 interpolation filter operation. LUT_0 is divided into the filter coefficient groups of LUT0_0~LUT3_0, LUT_1 is divided into the filter coefficient groups of LUT0_1~LUT3_1, LUT_C is divided into filter coefficient groups of LUT0_C~LUT3_C, LUT_2 is divided into the filter coefficient groups of LUT0_2~LUT3_2 and LUT_3 is divided into the filter coefficient groups of LUT0_3~LUT3_3. However, using the right and left symmetry of the coefficients mentioned above, the LUT0_2~LUT3_2 filter coefficient groups in the LUT_2 part and the LUT0_3~LUT3_3 filter coefficient groups in the LUT_3 part are not implemented into a look-up table. Instead, the amount of the look-up table can be reduced in half, by transforming inputted addresses to access the LUT_0 part and the LUT_1 part.

Taking the LUT0_0 filter coefficient as an example, the symmetry within the look-up table will be explained.

LUT0_0 consists of six coefficients of C0, C4, C8, C12, C16 and C20. If it takes +Cn in case that the input is 0 and takes −Cn in case that the input is 1, the following look-up table values can be obtained depending on 64 states of the input 6 bits.

| | |
|---|---|
| 000000 | + C0 + C4 + C8 + C12 + C16 + C20 |
| 000001 | + C0 + C4 + C8 + C12 + C16 − C20 |
| . | . |
| . | . |
| . | . |
| 111110 | − C0 − C4 − C8 − C12 − C16 + C20 |
| 111111 | − C0 − C4 − C8 − C12 − C16 − C20 |

Where, the first value and the last value are opposite in symbol but the amount are same. In other words, among the 64 look-up table values, the former 32 values and the latter 32 values are symmetry having different symbols but same values. Therefore, the number of instances within the look-up table of LUT0_0 is implemented using the number of $2^5$ not $2^6$. If the most significant bit (C0) of the input bit is 0, it outputs the look-up table value. On the other hand, if the bit(C0) is 1, it outputs an inverted symbol, so that the number of instances within the look-up table can be reduced in half.

Figure 5:
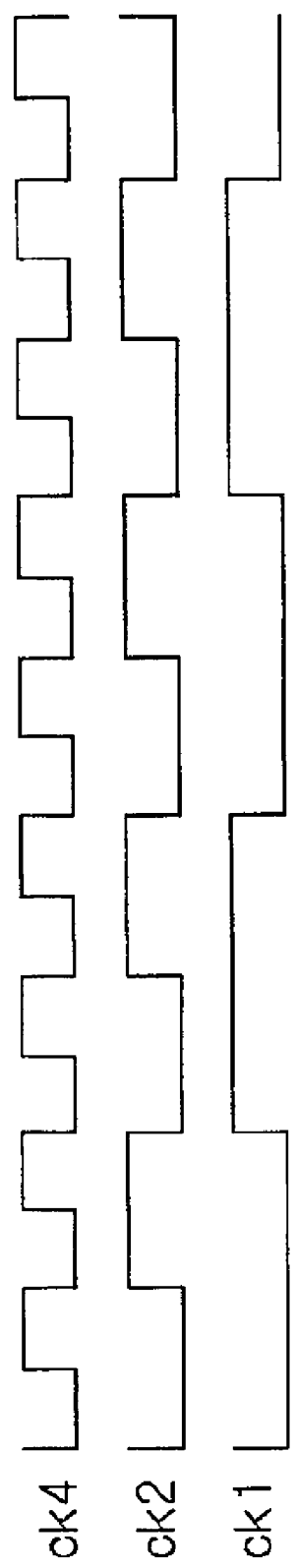
FIG. 5 is a timing chart of a clock used in the present invention.

FIG. 5 is a timing chart of a clock used in the filter according to the present invention. CK1 indicates an input frequency of the filter and CK4 indicates an output frequency of the filter. CK2 and CK1 can be easily generated by performing two division and four division, respectively, at a falling edge of CK4, or if there exists a clock faster twice than ck4, ck4, ck2 and ck1 can be sequentially generated by means of 3-bit counter.

Figure 6:
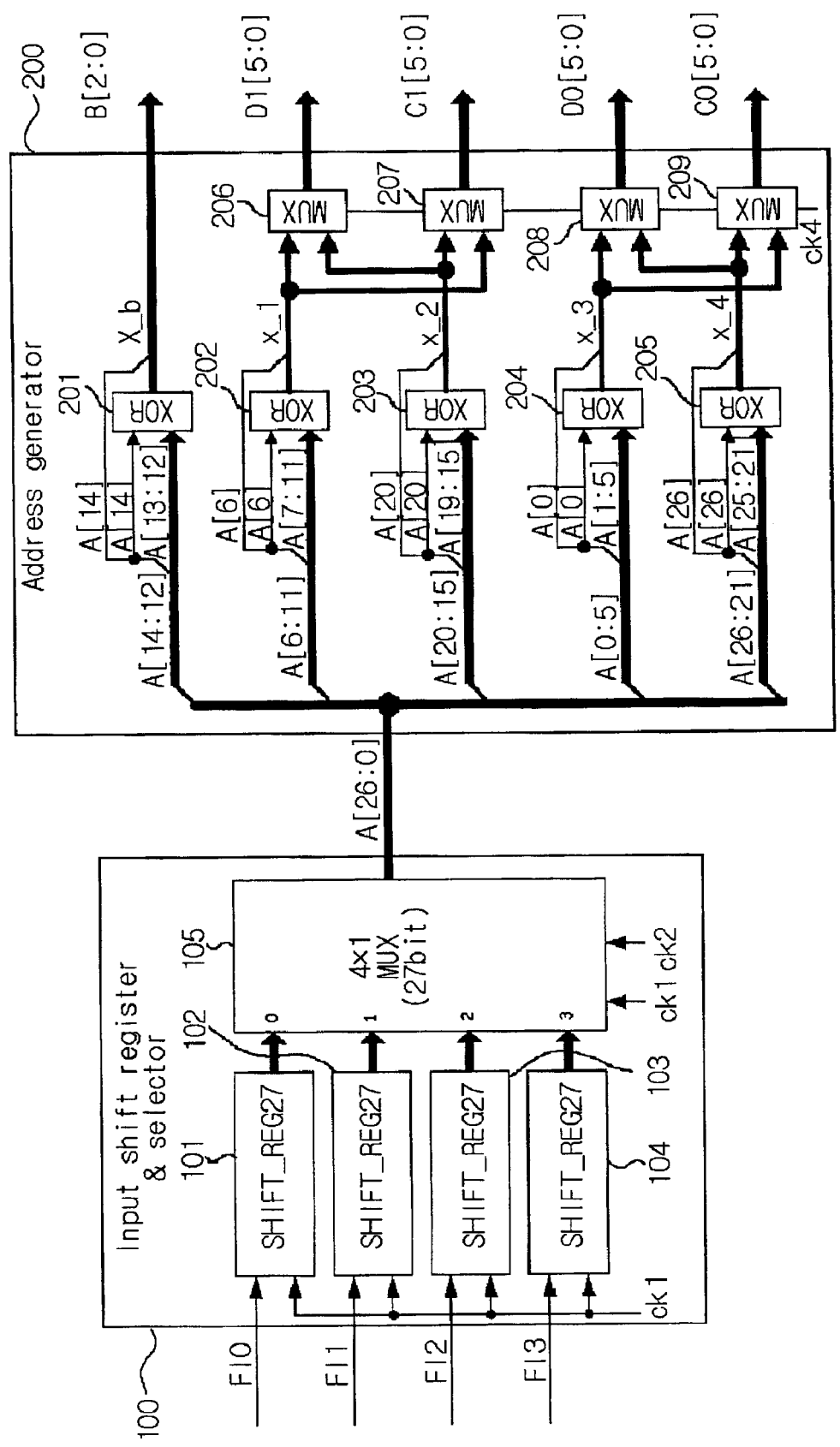
FIG. 6 is a detailed diagram of an input shift register, a selector and an address generator according to the present invention.

FIG. 6 is a detailed diagram of the input shift register and selector 100 and the address generator 200 according to the present invention.

The input shift register and selector 100 includes four shift_reg27 101~104 for sequentially receiving different 4-channel filter inputs F10, F11, F12 and F13 to produce 27-bit parallel data, and a 4×1 multiplexer 105 for sequentially selecting the four 27-bit parallel data inputted from the shift reg27 101~104 using CK1 and CK2 to output A[26:0].

The address generator 200 includes five XOR gates 201~205 for logically XOR-ing the most significant bit (MSB) and the remaining bits of the inputted address using the symmetry within the look-up table in order to access omitted address of the look-up table, and four multiplexers 206~209 for accessing twice LUT_1 and LUT_0 instead of omitted LUT_2 and LUT_3 using the symmetry of the filter coefficient.

That is, A[26:0] outputted from the input shift register & selector 100 is divided into five parts in the address generator 200, which includes A[14:12], A[6:11], A[20:15], A[0:5] and A[26:21]. A[14] of A[14:12] and A[13:12] are logically XOR-ed in the first XOR gate 201, thereby producing B[2:0]. B[2:0] is an address for LUT0_C~LUT3_C, where B[2]=A[14], B[1]=A[14]⊕A[13], B[0]=A[14]⊕A[12].

As such, in the A[6:11], A[20:15], A[0:5] and A[26:21] divided into five parts, the most significant bits A[6], A[20], A[0] and A[26] and the remaining bits A[7:11], A[19:15], A[1:5] and A[25:21] are logically XOR-ed, thereby producing x_1, x_2, x_, and x_4. At this time, x_1 is (A[6], A[6]⊕A[7], A[6]⊕A[8], A [8], A[9], A[6]⊕A [10] and A[6]⊕A[11]), x_2 is (A[20], A[20]⊕A[19], A [20]⊕A[18], A[20]⊕A[17], A[20]⊕A[16] and A[20]⊕A[15]), x_3 is (A[1], A[0]⊕A[1],A[0]⊕A[2], A[0]⊕A[3], A[0]⊕A[4] and A[0]⊕A[5]), and x_4 is (A[26], A[26]⊕A[25], A[26]⊕A [24], A[26]⊕A[23], A[26]⊕A[22] and A [26]⊕A[21].

x_1 and x_2 are inputted to the first multiplexer 206 and the second multiplexer 207, and x_3 and x_4 are inputted to the third multiplexer 208 and the fourth multiplexer 209. The multiplexers 206, 207, 208 and 209 select signals to be inputted into upper terminals if ck4 is 0 and select signals to be inputted to lower terminals if ck4 is 1, thereby producing output signals of D1[5:0], C1[5:0], D0[5:0] and C0[5:0], respectively.

Therefore, if ck4 is 0, D1[5:0] is x_1, C1[5:0] is x_2, D0[5:0] is x_3 and C0[5:0] is x_4. On the other hand, if ck4 is 1, D1[5:0] is x_2, C1[5:0] is x_1, D0[5:0] is x_4 and C0[5:0] is x_3.

Thus, in C0[5:0], if ck4 is 0, C0[5]=A[26], C0[4]=A[26]⊕A[25], C0[3]=A[26 ]⊕A[24], C0[2]=A[26]⊕A[23], C0[1]=A[26]⊕A[22] and C0[0]=A[26]⊕A[21]. If ck4 is 1, C0[5]=A[0], C0[4]=A[0]⊕A[1], C0[3]=A[0]⊕A[2]=A[0] C0[1]=A[0]⊕A[4] and C0[0]=A[0]⊕A[5].

Figure 7:
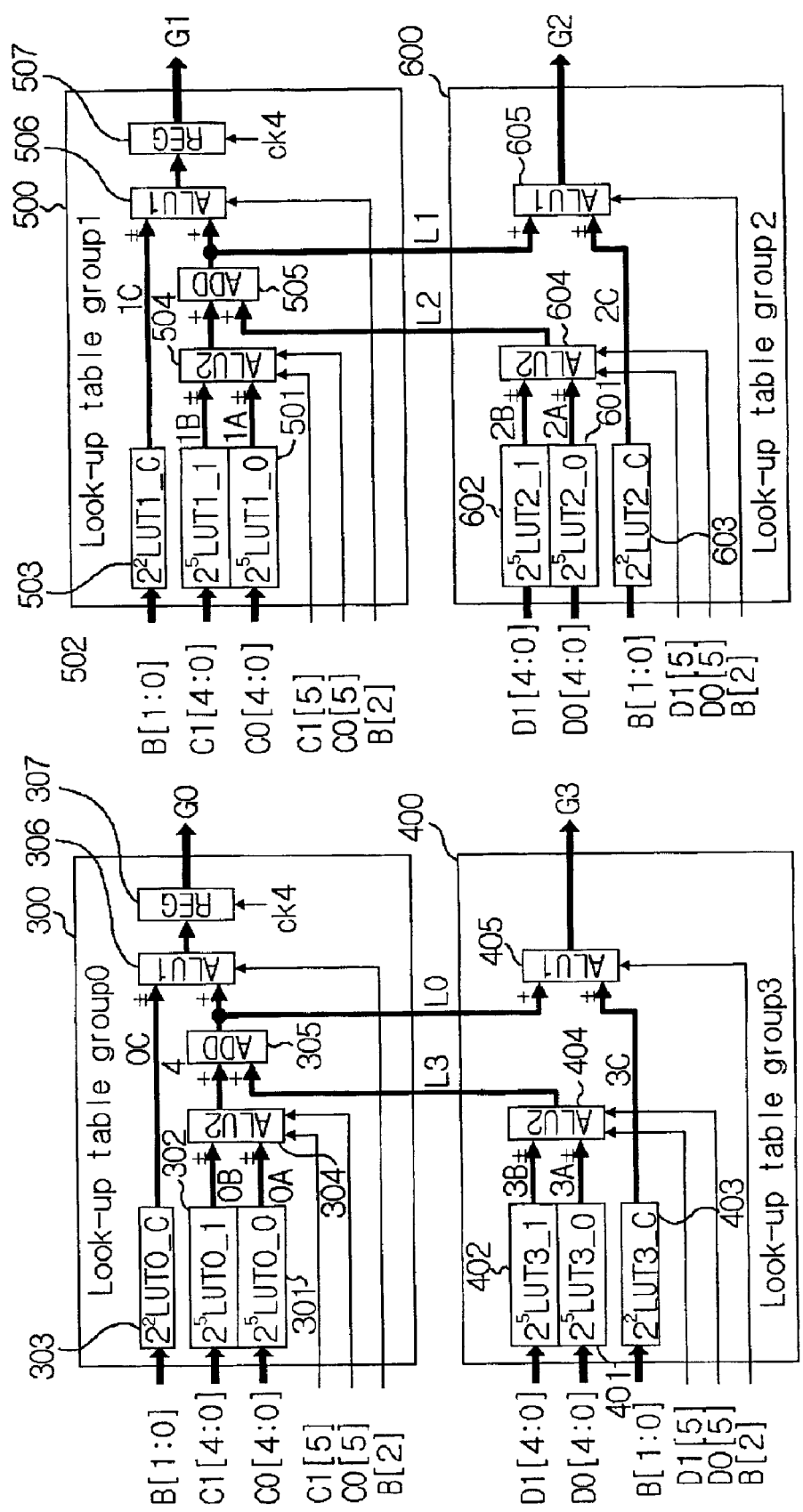
FIG. 7 is a detailed diagram of a look-up table group 0~a look-up table group 3 according to the present invention.

FIG. 7 is a detailed diagram of the look-up table group 0~ the look-up table group 3 according to the present invention.

The look-up table group 0 300 is a block for creating the filtering result of the filter coefficient group 0 filter by means of the look-up table and an operation, and its operation is as follows.

C0[4:0] is inputted to a LUT0_0 301 to output 0A of one of 32 look-up table values, C1[4:0] is inputted to a LUT0_1 302 to output 0B of one of 32 look-up tables and B[1:0] is inputted to a LUT0_C 303 to output 0C of one of 4 look-up table values. The arithmetic logic unit (ALU) 304 is a calculating circuit for compensating for omitted look-up table values for the symmetry within the look-up table and performs the operation such as Equation 1 below.

If $C0[5]=0$ and $C1[5]=0$, ALU2 output=$0A+0B$

If $C0[5]=0$ and $C1[5]=1$, ALU2 output=$0A-0B$

If $C0[5]=1$ and $C1[5]=0$, ALU2 output=$-0A+0B$ and

If $C0[5]=1$ and $C1[5]=1$, ALU2 output=$-0A-0B$       Equation b 1

Meanwhile, the look-up table group 3 400 performs the following operation in order to calculate LUT0_2 and LUT0_3 that are removed by the coefficient symmetry characteristic by operating the filtering result of the filter coefficient group 3 and the look-up table.

That is, D1[4:0] is inputted to a LUT3_1 402 to output 3B of one of 32 look-up table values, D0[4:0] is inputted to a LUT3_0 401 to output 3A of one of 32 look-up table values and B[1 :0] is inputted to a LUT3_C 403 to output 3C of one of 4 look-up table values. The above 3B and 3A are inputted to an arithmetic logic unit (ALU2) 404. The ALU2 404 is a calculating circuit for compensating for omitted look-up table values for the symmetry within the look-up table and performs the operation such as Equation 1 above.

The calculating result L3 of the ALU2 404 and the calculating result of the ALU2 304 are inputted to the ADD 305, which then produces LO. The L0 and 0C outputted from the LUT0_C 303 are inputted to the ALU1 306, and the LO and the 3C outputted from the LUT3_C 403 are inputted to the ALU1 405. The output value of the ALU1 405 is determined by B[21]. If B[2]=0, the output of the ALU1 306 is L0+0C and the output of the ALU1 405 is L0 +3C. On the other hand, if B[21 ]=1, the output of the ALU1 306 is L0 −0C and the output of the ALU1 405 is L0−3C. The REG 307, a register for storing G0, an output of the look-up table group 0 by means of a rising edge of ck4, is used to buffer the output value of the look-up table group 0 300 twice accessed due to the symmetry of the coefficient. The ALU1 405 outputs G3, an output of the look-up table group 3.

With the same method to the operation of the look-up table group 0 300 and the look-up table group 3 400, the look-up table group 1 500 and the look-up table group 2 600 are operated to produce filter outputs G0, G1, G2 and G3.

Figure 8:
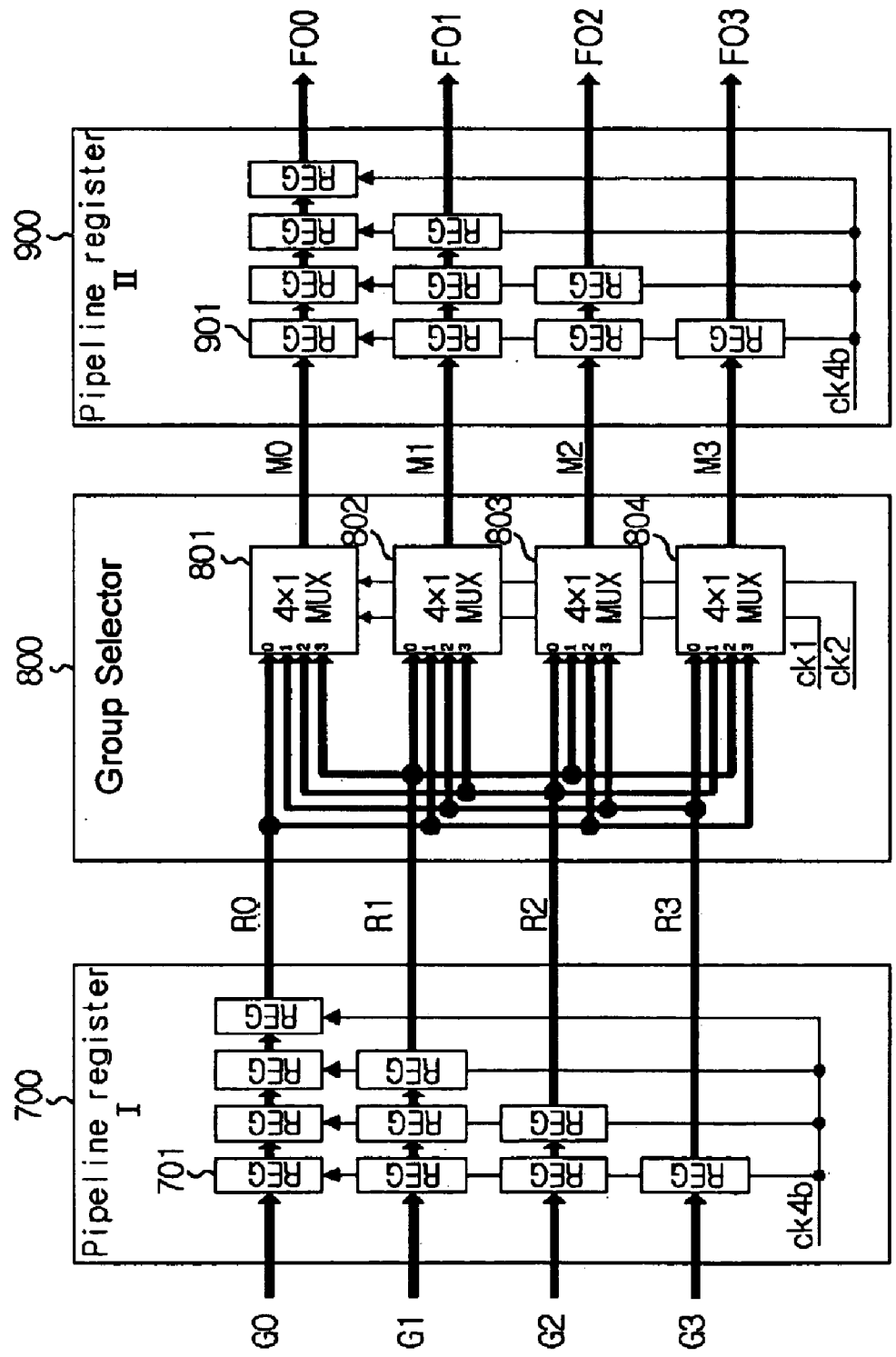
FIG. 8 is a detailed diagram of pipeline registers (I, II) and a group selector according to the present invention.

FIG. 8 is a detailed diagram of the pipeline registers (I, II) and the group selector according to the present invention.

The pipeline register I 700 functions to delay filter outputs G0, G1, G2 and G3 for four look-up table groups generated parallel simultaneously depending on corresponding coefficient groups so as to sequentially output the filter outputs. The pipeline register I 700 consist of ten registers REGs for storing input data at a negative edge of edge of ck4. G0 is delayed with four clocks via the four REGs and is outputted as R0, G1 is delayed with three clocks via the three REGs and is outputted as R1, G2 is delayed with clocks via the two REGs and is outputted as R2, G3 is delayed one clock via one REG and is outputted as R3.

The group selector 800 consists of four 4×1 multiplexers. The group selector 800 functions to select delayed signals of R0, R1, R2 and R3 from the pipeline registerI 700 using 4×1 multiplexers 801~804 controlled by ck1 and ck2 to serially produce the coefficient group outputs of each of filter outputs. As ck1 and ck2 are changed into "00", "01", "10" and "11", the 4×1 multiplexer 801 selects in the order of R0, R3, R2 and R1, the 4×1 multiplexer 802 selects in the order of R1, R0, R3 and R2, the 4×1 multiplexer 803 selects in the order of R2, R1, R0 and R3 and the 4×1 multiplexer 804 selects in the order of R3, R2, R1 and R0 to thereby produce outputs M0, M1, M2 and M3, respectively.

The pipeline register II 900 consists of ten registers REGs for storing at a negative edge of ck4. The pipeline register II 900 is used to in parallel match signals M0~M3 of time delay, which are outputted from the group selector 800, by respective filter output. The final filter output FO0 of the channel 0 produces M0 with four clocks delayed, the final filter output FO1 of the channel 1 produces M1 with three clock delayed, the final filter output FO2 of the channel 2 produces M2 with two clocks delayed, and the final filter output FO3 of the channel 3 produces M3 with one clock delayed.

What is claimed:

1. A 108-tap 1:4 interpolation FIR filter device for digital mobile communication, comprising:
    four shift registers for shifting and storing 1-bit filter inputs each inputted from four channels to produce 27-bit parallel data, respectively;
    a selector for sequentially selecting said 27-bit parallel data of the four channels one by one;
    an address generator for receiving said 27-bit parallel data outputted from the selector to produce addresses depending on look-up tables of each of coefficient groups;
    four look-up table groups for generating filter outputs of the coefficient groups using the addresses generated in said address generator;
    a pipeline register I for delaying filter outputs per coefficient groups outputted in parallel from said four look-up table groups;
    a group selector for serially transforming said delayed filter outputs from said pipeline register I, channel by channel; and
    a pipeline register II for delaying the output from said group selector to match the time of the filter output per channel.

2. The 108-tap 1:4 interpolation FIR filter device for digital mobile communication according to claim 1, wherein said address generator includes:
    five XOR calculators for dividing the 27-bit parallel data inputted from the four shift registers into five groups for accessing five coefficient groups (LUT_0, LUT_1 LUT_C LUT_2, LUT_3) and logically XOR-ing the most significant bit (MSB) and the remaining bits per the divided group in order to access addresses of omitted look-up table using the symmetry within the look-up table; and
    four multiplexers for transforming the address of said LUT_2 and LUT_3 in order to access said LUT_0 and LUT_1 twice to thereby access addresses of omitted LUT_2 and LUT_3 using the symmetry of the-filter coefficient.

3. The 108-tap 1:4 interpolation FIR filter device for digital mobile communication according to claim 1, wherein said four look-up table groups consist of coefficient group, respectively, and a look-up table within each of the look-up table groups is created by dividing 27 coefficients, said look-up table including LUT_0 having 6 coefficients, LUT_1 having 6 coefficients and LUT_C having 3 coefficients; and
    in look-up table group 0 and look-up table group 3, and look-up table group 1 and look-up table group 2, in order to provide an omitted look-up table value using the symmetry of coefficients, coefficient parts of LUT_0 and LUT1 within each of the look-up table groups are twice accessed, respectively.

4. The 108-tap 1:4 interpolation FIR filter device for digital mobile communication according to claim 3, wherein said LUT_0, LUT_1 and LUT_C reduce in half the number of a look-up table using the symmetry within the look-up table.

* * * * *